United States Patent
Kim et al.

(10) Patent No.: US 7,736,844 B2
(45) Date of Patent: Jun. 15, 2010

(54) OVERLAY MARK AND METHOD OF FORMING THE SAME

(75) Inventors: Dae-Joung Kim, Suwon-si (KR); Ji-Yong You, Suwon-si (KR); Hyun-Seok Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 498 days.

(21) Appl. No.: 11/826,745

(22) Filed: Jul. 18, 2007

(65) Prior Publication Data

US 2008/0032208 A1    Feb. 7, 2008

(30) Foreign Application Priority Data

Aug. 3, 2006    (KR) .................... 10-2006-0073208

(51) Int. Cl.
*G03F 1/00* (2006.01)
*H01L 23/544* (2006.01)

(52) U.S. Cl. ...................... 430/394; 257/797

(58) Field of Classification Search .............. 430/5, 430/22, 394; 716/19, 20, 21; 257/797
See application file for complete search history.

(56) References Cited

U.S. PATENT DOCUMENTS 6,936,931 B2 *   8/2005   Baek et al. ............... 257/797

FOREIGN PATENT DOCUMENTS

| JP | 2000-294490 | 10/2000 |
| JP | 2002-246285 | 8/2002 |
| KR | 1020010005118 A | 1/2001 |
| KR | 1020020072044 A | 9/2002 |
| KR | 1020040046854 A | 6/2004 |
| KR | 1020050110467 A | 11/2005 |

* cited by examiner

*Primary Examiner*—Stephen Rosasco
(74) *Attorney, Agent, or Firm*—Harness, Dickey & Pierce, P.L.C.

(57) ABSTRACT

An overlay mark may include a main overlay pattern and an auxiliary overlay pattern, wherein the main overlay pattern may have an opening exposing a substrate and the auxiliary overlay pattern may be formed in the opening. The auxiliary overlay pattern may be spaced apart from a sidewall of the main overlay pattern defining the opening. The thickness ratio of the auxiliary overlay pattern to the main overlay pattern may be about 0.05:1 to about 0.30:1. Accordingly, overlay accuracy measurements may be improved using the clearer overlay mark according to example embodiments.

20 Claims, 6 Drawing Sheets

OVERLAY MARK AND METHOD OF FORMING THE SAME

PRIORITY STATEMENT

This application claims priority under 35 U.S.C. §119 to Korean Patent Application No. 10-2006-0073208, filed on Aug. 3, 2006 in the Korean Intellectual Property Office (KIPO), the entire contents of which are incorporated herein by reference.

BACKGROUND

1. Technical Field

Example embodiments relate to an overlay mark for measuring overlay accuracy of circuit patterns sequentially stacked on a semiconductor substrate and a method of forming the same.

2. Description of the Related Art

A semiconductor device may be manufactured by repeatedly forming thin layers having electrical circuit patterns on a semiconductor substrate (e.g., a silicon wafer). The thin layers may be formed by various processes, including chemical vapor deposition (CVD), physical vapor deposition (PVD), atomic layer deposition (ALD), and other suitable processes. The circuit patterns may be formed by a photolithography process.

Overlay accuracy of the thin layers may be measured using an overlay mark formed on the thin layers. The overlay mark may include a lower overlay pattern formed on a lower layer and an upper overlay pattern formed on an upper layer. The overlay mark may have a box-in-box shape. Overlay accuracy may be determined by measuring the alignment of the lower overlay pattern and the upper overlay pattern. An alignment correction value of a wafer and a photo mask or a reticle in a photolithography process may be adjusted based on the overlay accuracy. As semiconductor devices may become more integrated, the size of patterns on the semiconductor substrate may decrease. Consequently, accurate measurement of the overlay in a photolithography process may become more important.

Figure 1:
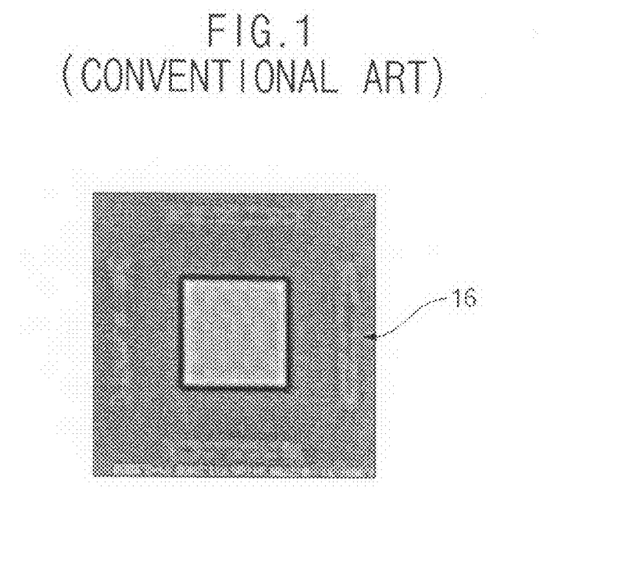
FIG. 1 is a scanning electron microscope (SEM) image showing a conventional overlay mark.
Figure 2:
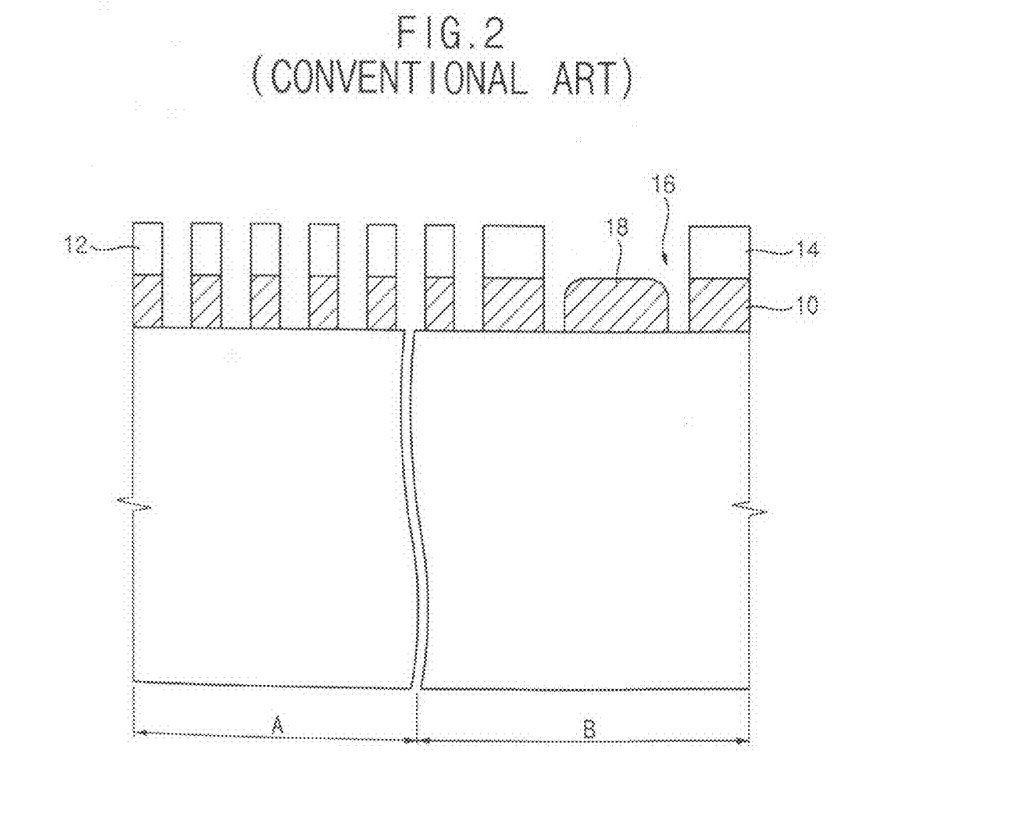
FIG. 2 is a cross-sectional view illustrating the conventional overlay mark in FIG. 1.

FIG. 1 is a scanning electron microscope (SEM) image showing a conventional overlay mark. FIG. 2 is a cross-sectional view illustrating the conventional overlay mark in FIG. 1. Referring to FIGS. 1 and 2, first photoresist patterns 12 may be formed on a cell region A of a semiconductor substrate, and second photoresist patterns 14 may be formed on a scribe lane region B of the semiconductor substrate. To form circuit patterns in the cell region A, the first photoresist patterns 12 may be arranged more densely in the cell region A. In contrast, to form an overlay mark 16 in the scribe lane region B, the second photoresist patterns 14 may be arranged more sparsely in the scribe lane region B compared to the first photoresist patterns 12 in the cell region A. The second photoresist patterns 14 may be wider than the first photoresist patterns 12.

In an etching process using a photoresist pattern as a mask, the etching speed in a larger etching area may be greater than the etching speed in a smaller etching area depending on etching conditions. For example, a phenomenon referred to as "reverse reactive ion etching (RIE) lag" may be caused by the use of gases (e.g., hexafluorethane ($C_2F_6$), perfluoropropane ($C_3F_8$), octafluorocyclobutane ($C_4F_8$)) that generate larger amounts of polymer during the etching process.

When a layer 10 is etched using the first photoresist pattern 12 and the second photoresist pattern 14 as an etching mask, the etching conditions may be determined in accordance with the width of the first photoresist pattern 12 in the cell region A. However, an opening formed using the second photoresist pattern 14 may have a width greater than an opening formed using the first photoresist pattern 12. Consequently, polymer may accumulate on an exposed portion of the layer 10 via the second photoresist pattern 14 during the etching process. The accumulated polymer may interfere with the etching process such that process failures (e.g., etching stop) may occur. The etching failure may obstruct formation of the overlay mark 16. Furthermore, a pattern 18 may be formed in the opening (e.g., overlay mark 16). As a result, the pattern 18 in the overlay mark 16 may render it more difficult to identify the overlay mark 16 when measuring overlay accuracy. Accordingly, the reliability of the overlay accuracy measurement may be lowered.

SUMMARY OF EXAMPLE EMBODIMENTS

Example embodiments provide an overlay mark enabling improved overlay accuracy measurements and a method of forming the same. An overlay mark according to example embodiments may include a main overlay pattern having an opening exposing a substrate and an auxiliary overlay pattern in the opening. The auxiliary overlay pattern may be spaced apart from a sidewall of the main overlay pattern. The ratio of auxiliary overlay pattern thickness to main overlay pattern thickness may be about 0.05:1 to about 0.30:1. The ratio of opening width to opening height may range from about 1:0.5 to about 1:0.6. The ratio of opening width to auxiliary overlay pattern width may be about 1:0.05 to about 1:0.30. The main overlay pattern may include substantially the same material as the auxiliary overlay pattern. The opening and auxiliary overlay pattern may extend along a surface of the substrate. Additionally, the opening and the auxiliary overlay pattern may have a rectangular, annular shape.

A method of forming an overlay mark according to example embodiments may include forming a layer on a substrate and patterning the layer to form a main overlay pattern and an auxiliary overlay pattern. The main overlay pattern may have an opening exposing a substrate, and the auxiliary overlay pattern may be in the opening and spaced apart from a sidewall of the main overlay pattern. The opening and auxiliary overlay pattern may extend along the surface of the substrate. The ratio of auxiliary overlay pattern thickness to main overlay pattern thickness may be about 0.05:1 to about 0.30:1. The ratio of opening width to opening height may range from about 1:0.5 to about 1:0.6. The ratio of opening width to auxiliary overlay pattern width may be about 1:0.05 to about 1:0.30.

Forming the main overlay pattern and the auxiliary overlay pattern may include forming a main photoresist pattern and an auxiliary photoresist pattern on the layer and etching the layer using the main photoresist pattern and the auxiliary photoresist pattern as an etching mask to thereby form the main overlay pattern and the auxiliary overlay pattern. The main photoresist pattern may have a second opening exposing the layer, and the auxiliary photoresist pattern may be in the second opening. The layer may be etched until the auxiliary photoresist pattern is consumed or otherwise removed by the etching process.

Forming the main photoresist pattern and the auxiliary photoresist pattern may include forming a photoresist film on the layer; providing a photo mask having a first light transmission portion and a second light transmission portion over the photoresist film; irradiating a first light having a first light intensity through the first light transmission portion of the photo mask onto a first region of the photoresist film; irradiating a second light having a second light intensity through the second light transmission portion of the photo mask onto a second region of the photoresist film, the second light intensity being greater than the first light intensity; and developing the irradiated regions of the photoresist film to form the main photoresist pattern and the auxiliary photoresist pattern.

The ratio of main photoresist pattern thickness to auxiliary photoresist pattern thickness may be about 1:0.5 to about 1:0.7. A ratio of second opening width to auxiliary photoresist pattern width may be about 1:0.5 to about 1:0.8. The first light intensity may be about 30% to about 50% of the second light intensity. A grating pattern may be provided in the first light transmission portion of the photo mask to control the first light intensity irradiated onto the first region of the photoresist film. The grating pattern may include a line-and-space pattern extending in substantially the same direction. The ratio of critical line width to critical space width in the line-and-space pattern may be about 1:1. The critical width of each line and space in the line-and-space pattern may range from about 25 nm to about 50 nm.

According to example embodiments, the main photoresist pattern and the auxiliary photoresist pattern may be formed on the layer as an etching mask for forming the overlay mark. Consequently, byproducts generated by the etching process for forming the overlay mark may accumulate on the auxiliary photoresist pattern, thereby reducing or preventing the adherence of byproducts to the layer. Accordingly, because the auxiliary photoresist pattern may be employed in forming the overlay mark, etching failures (e.g., etching stop, RIE lag) may be reduced or prevented. As a result, the overlay mark may be formed more clearly, thus improving overlay accuracy measurements.

DETAILED DESCRIPTION OF EXAMPLE EMBODIMENTS

Example embodiments may be described herein with reference to the accompanying drawings. Example embodiments, however, may be embodied in many different forms and should not be construed as limited to the examples set forth herein. In the drawings, the size of the layers and regions may have been exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
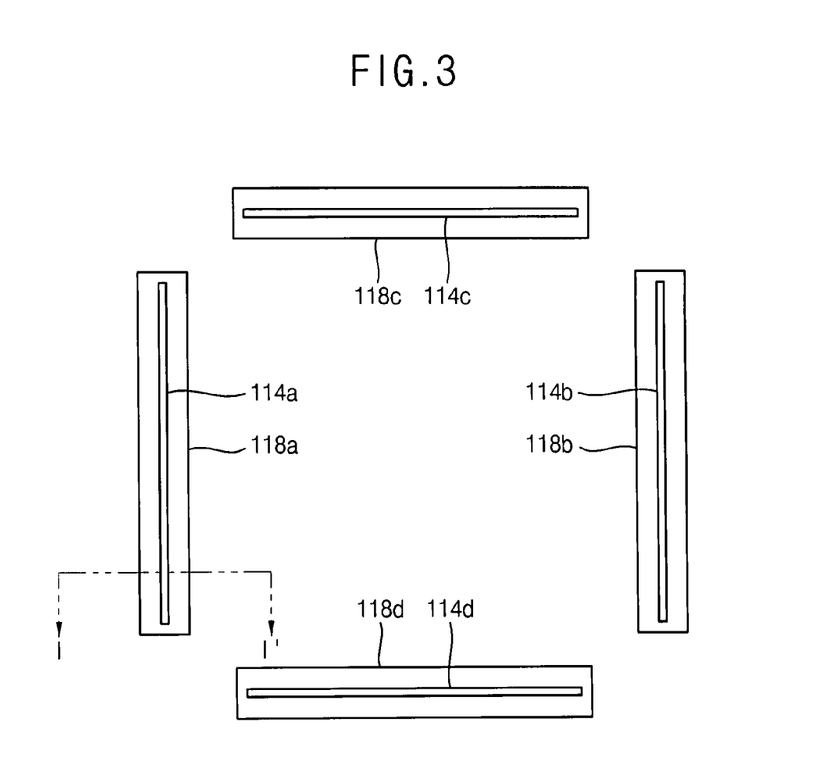
FIG. 3 is a plan view illustrating an overlay mark according to example embodiments.
Figure 4:
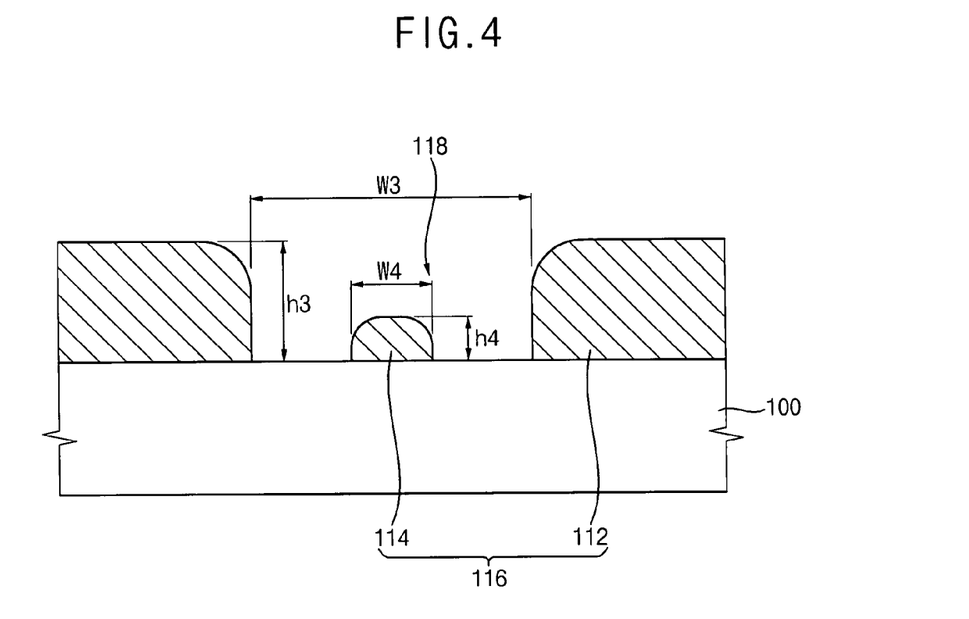
FIG. 4 is a cross-sectional view of the overlay mark according to example embodiments in FIG. 3, taken along line I-I'.

FIG. 3 is a plan view illustrating an overlay mark according to example embodiments. FIG. 4 is a cross-sectional view of the overlay mark in FIG. 3 according to example embodiments, taken along line I-I'. Referring to FIGS. 3 and 4, an overlay mark 116 is illustrated according to example embodiments. Referring to FIG. 3, a first opening 118a, a second opening 118b, a third opening 118c, and a fourth opening 118d may have substantially the same shape. Thus, the first to fourth openings 118a-118d may be represented by numerical reference 118 in FIG. 4. The four auxiliary overlay patterns 114a, 114b, 114c, and 114d may also have substantially the same shape. Thus, the auxiliary overlay patterns 114a-114d may be represented by numerical reference 114 in FIG. 4.

A semiconductor substrate 100 (e.g., a silicon wafer) may have a plurality of element formation regions (not shown). The element formation regions may be divided by a plurality of intersecting scribe lanes (not shown). A first layer (not shown) and a second layer (not shown) may be formed on the semiconductor substrate 100. The overlay mark 116 may be used to measure the overlay accuracy of a first circuit pattern (not shown) on the first layer and a second circuit pattern (not shown) on the second layer. The overlay mark 116 may be formed on the first layer of the scribe lane. The overlay mark 116 may include a main overlay pattern 112 and an auxiliary overlay pattern 114. The main overlay pattern 112 may have an opening 118 for exposing the semiconductor substrate 100. The auxiliary overlay pattern 114 may be formed in the opening 118 on the exposed portion of the semiconductor substrate 100.

The main overlay pattern 112 may include a conductive material or an insulation material. The main overlay pattern 112 may be obtained by forming the first layer by a chemical vapor deposition (CVD) process, a physical vapor deposition (PVD) process, and an atomic layer deposition (ALD) process and patterning the first layer. The auxiliary overlay pattern 114 may include substantially the same materials as the main overlay pattern 112 and may be formed by substantially the same processes.

The auxiliary overlay pattern 114 may be spaced apart from a sidewall of the main overlay pattern 112 that defines the opening 118. The opening 118 may have a ratio of a width W3 to height h3 ranging from about 1:0.5 to about 1:0.6. The auxiliary overlay pattern 114 may have a width W4 and a thickness h4, and the main overlay pattern 112 may have a thickness h3. The auxiliary overlay pattern 114 may have a thickness ratio of about 0.05:1 to about 0.30:1 with respect to the main overlay pattern 112.

The overlay mark 116 may have a frame shape, a bar shape, and/or a rectangular belt shape. For example, the overlay mark 116 may have a rectangular box shape linearly extending along a surface of the semiconductor substrate 100. The auxiliary overlay pattern 114 in the opening 118 may extend in substantially the same direction as the opening 118. The opening 118 and the auxiliary overlay pattern 114 may have a rectangular, annular shape.

The overlay mark 116 may have first and second openings 118a and 118b extending substantially in parallel along a first direction through the first layer on the semiconductor substrate 100. The third and fourth openings 118c and 118d may extend substantially in parallel through the first layer on the semiconductor substrate 100, wherein the third and fourth openings 118c and 118d extend along a second direction that is substantially perpendicular to the first direction. Thus, the first and second openings 118a and 118b may be substantially perpendicular to the third and fourth openings 118c and 118d. For example, the first to fourth openings 118a, 118b, 118c, and 118d may not intersect. Consequently, the first to fourth openings 118a, 118b, 118c, and 118d may form a rectangular, annular shape without corners. Alternatively, the first to fourth openings 118a, 118b, 118c, and 118d may intersect.

The auxiliary overlay patterns 114a, 114b, 114c, and 114d in the first to fourth openings 118a, 118b, 118c, and 118d, respectively, may form substantially the same shape as the first to the fourth openings 118a, 118b, 118c, and 118d. Consequently, the auxiliary overlay patterns 114a, 114b, 114c, and 114d in the first to fourth openings 118a, 118b, 118c, and 118d, respectively, may not intersect. As a result, the auxiliary overlay patterns 114a, 114b, 114c, and 114d may form a rectangular, annular shape without corners. Alternatively, the auxiliary overlay patterns 114a, 114b, 114c, and 114d may intersect.

An upper overlay mark (not shown) for measuring overlay accuracy of the first layer and the second layer may be formed on the second layer. The upper overlay mark may be arranged on an inner, central portion of the overlay mark 116. The upper overlay mark may have a box shape. The upper overlay mark may be referred to as a vernier. The upper overlay mark may be used to measure overlay accuracy of a first circuit pattern on the first layer and a second circuit pattern on the second layer. The upper overlay mark may include a photoresist pattern and may be formed by a photolithography process.

A method of measuring an overlay using the overlay mark 116 and the upper overlay mark may be briefly described below. A vertical offset, a horizontal offset, a rotation, and a perpendicular value based on the overlay mark and the upper overlay mark may be measured to obtain an overlay correction value. An overlay measurement toll may detect a light intensity signal generated from the overlay mark and a light intensity contrast generated from the upper overlay mark to obtain the overlay correction value. The overlay correction value may be used as an alignment correction value of an exposure apparatus in an exposure process.

Figure 5:
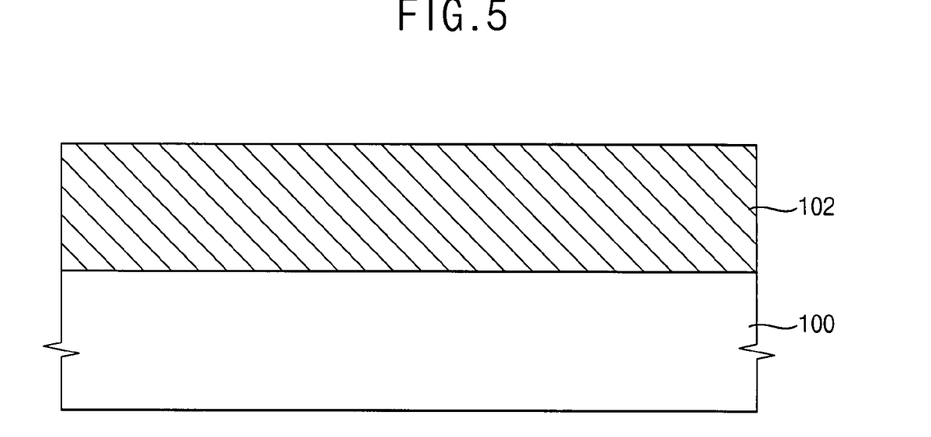
FIGS. 5 to 9 are cross-sectional and plan views illustrating a method of forming the overlay mark in FIG. 4 according to example embodiments.

FIGS. 5 to 9 are cross-sectional and plan views illustrating a method of forming the overlay mark in FIG. 4 according to example embodiments. Referring to FIG. 5, the semiconductor substrate 100 having a circuit region (not shown) and a scribe lane region (not shown) may be prepared. A layer 102, which may be converted into a circuit pattern, may be formed on the circuit region of the semiconductor substrate 100. While forming the circuit pattern, the overlay mark 116 (FIG. 4) may be simultaneously formed on the scribe lane region. The layer 102 may include a conductive material or an insulation material. The layer 102 may be formed by a CVD process, a PVD process, an ALD process, or another suitable process. Before forming the layer 102, a sub-layer (not shown) having a higher reflexibility may be formed on the semiconductor substrate 100. The sub-layer may improve overlay measurement accuracy. For example, a sub-layer having higher reflexibility may include a metal silicide layer obtained by silicidating silicon in the semiconductor substrate 100 with a metal.

Figure 6:
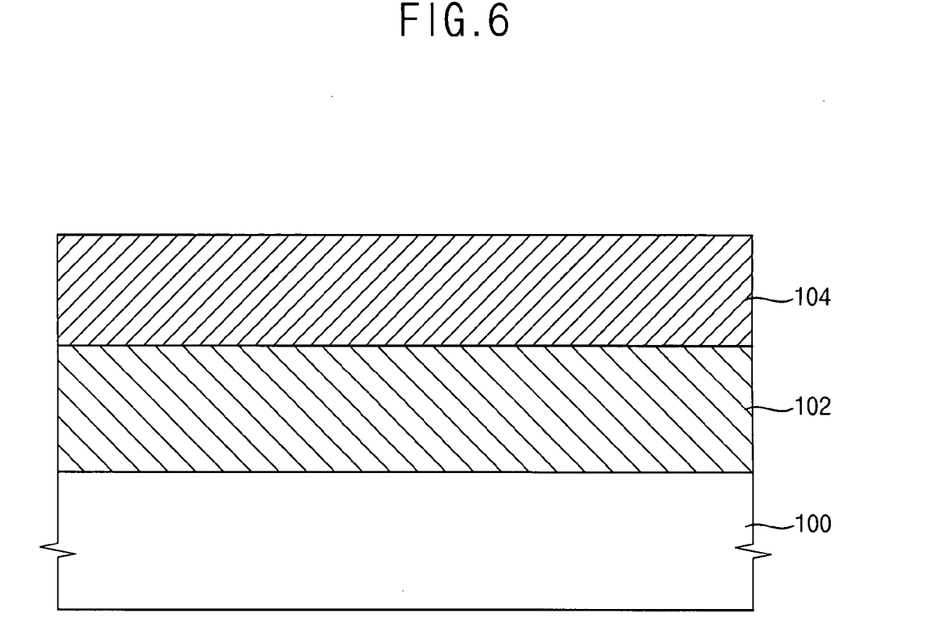
Figure 7:
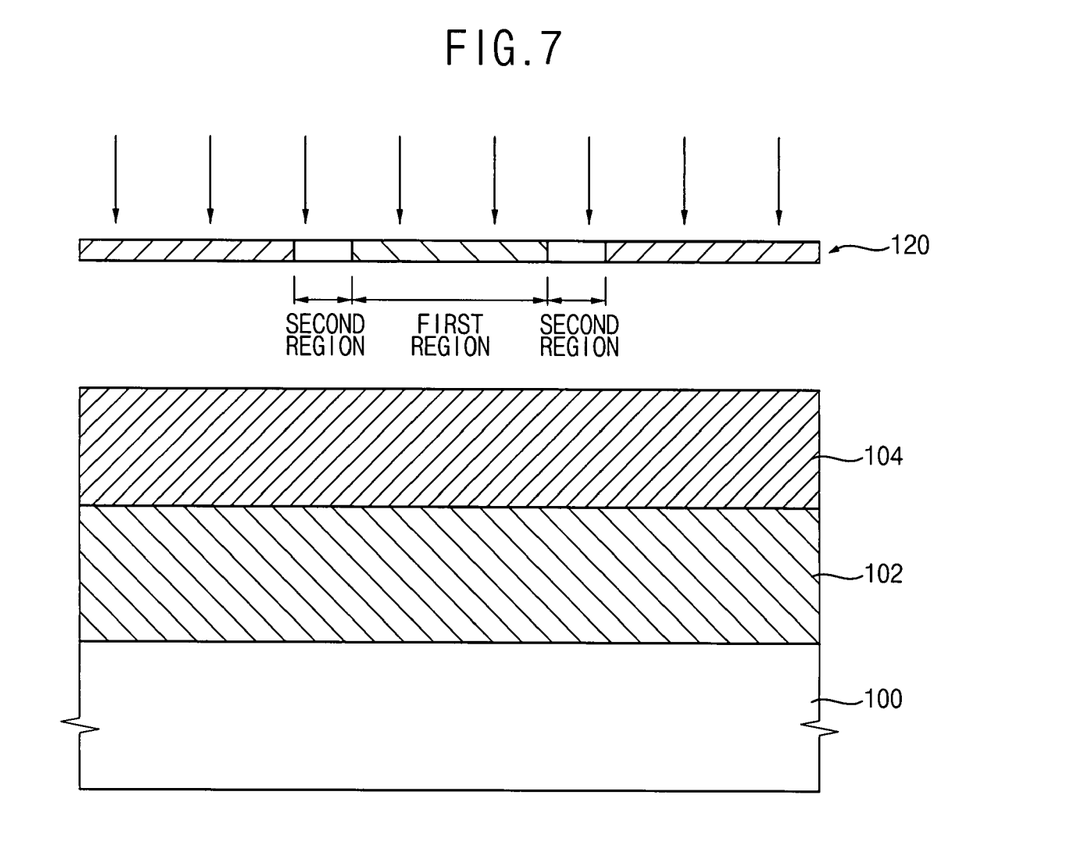
Figure 8:
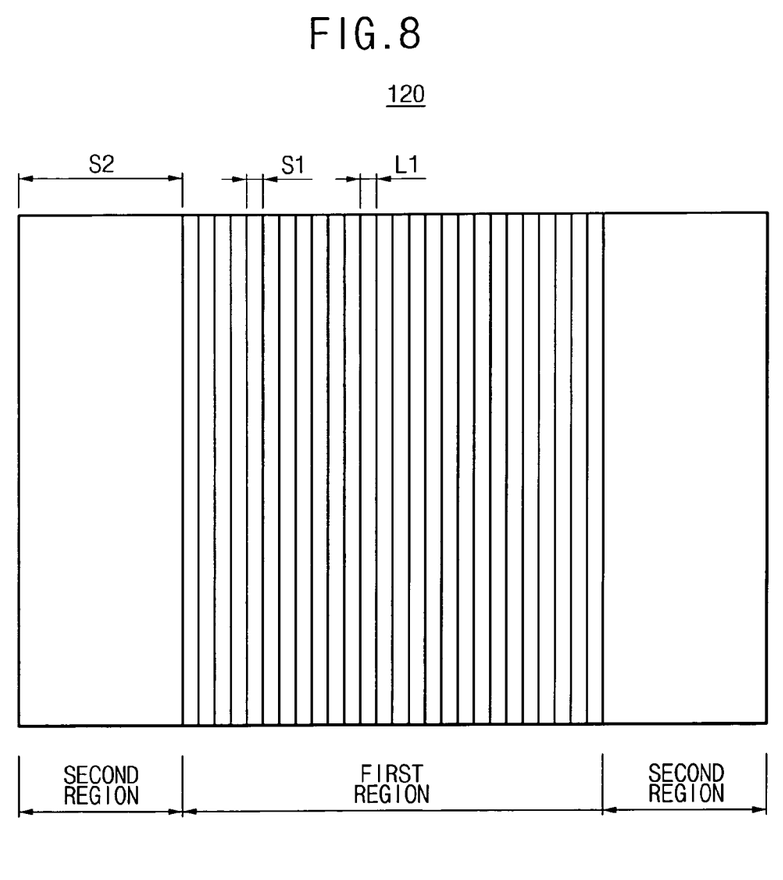

Referring to FIG. 6, a photoresist film 104 may be formed on the layer 102. Referring to FIGS. 7 and 8, the photoresist film 104 may be selectively exposed. To selectively expose the photoresist film 104, a first light having a first light intensity and a second light having a second light intensity may be irradiated onto the photoresist film 104. The second light intensity may be higher than the first light intensity. The first light may be irradiated onto a first region of the photoresist film 104 where an auxiliary photoresist pattern is to be formed. In contrast, the second light may be irradiated onto a second region of the photoresist film 104, which may exclude the first region.

For example, a photo mask 120 may be arranged over the photoresist film 104. The photo mask 120 may have a first light transmission portion corresponding to a first region on the photoresist film 104, where the auxiliary photoresist pattern 108 (FIG. 9) may be formed, and a second light transmission portion corresponding to a second region on the photoresist film 104, which may exclude the first region. The combined first and second regions may correspond to the second opening 110 (FIG. 9) that may be formed in the photoresist film 104.

The first light transmission portion and the second light transmission portion of the photo mask 120 may have different transmissivities. For example, light may be partially transmitted through the first light transmission portion and entirely transmitted through the second light transmission portion. The remaining portion of the photo mask 120 (which may exclude the first and second light transmission portions) may correspond to a region where the circuit pattern may be formed. Thus, light having a circuit image may be transmitted through the remaining portion of the photo mask 120.

A grating pattern allowing light to be partially transmitted may be formed in the first light transmission portion of the photo mask 120. The grating pattern may be formed by a process where a surface of a mask wafer including quartz may be etched. Light vertically incident from a light source may be diffracted through the grating pattern. Thus, a first light transmitted through the first light transmission portion may have a first light intensity lower than a second light intensity of a second light transmitted through the second light transmission portion. For example, the first light intensity may be about 30% to about 50% of the second light intensity.

When an exposure process is performed using the photo mask 120, a first exposure energy may be applied to a first region of the photoresist film 104. In contrast, a second exposure energy may be applied to the second region of the photoresist film 104, wherein the second exposure energy may be higher than the first exposure energy. Therefore, when the exposed photoresist film 104 is developed, the photoresist film 104 may partially remain in the first region, while the photoresist film 104 in the second region may be completely removed. Accordingly, the rest of the photoresist film 140, except for the first and the second regions, may still remain.

The grating pattern may include line-and-space patterns extending in substantially the same direction. As shown in FIG. 8, the line-and-space patterns may be alternately arranged in intervals for use in a diffraction exposure process. In the diffraction exposure process, the intensity of light transmitted through a diffraction exposure region may be inversely proportional to a critical width of the line-and-space formed in the diffraction exposure region. Thus, a width and an interval between the line and the space may be important. When the width and the interval between the line and the space exceed an acceptable dimension, a desired diffraction effect may not be achieved. Additionally, the resulting photoresist pattern may have rugged portions because of non-uniform exposure. Furthermore, the photoresist film 104 may not even remain so as to result in a photoresist pattern. As a result, the exposure process may have a lower margin and lower reliability.

The line and the space of the line-and-space patterns may have a critical width ratio of about 1:1. The critical line width L1 or the critical space width S1 may be about 25 nm to about 50 nm. The second light transmission portion of the photo mask 120 corresponding to the second region of the photoresist film 104 may have a critical width S2 of about 0.25 μm to about 0.35 μm. According to example embodiments, the grating pattern may include a line-and-space pattern. Alternatively, the grating pattern may have other shapes (e.g., lattice shape).

A projection exposure apparatus (not shown) may be used to perform the exposure process. The projection exposure apparatus may include a light source, a condenser lens, and a projection lens. The light source may include an excimer laser for emitting an excimer laser beam. For example, the light source may include a KrF laser for emitting a KrF laser beam having a wavelength of about 248 nm, an ArF laser for emitting an ArF laser beam having a wavelength of about 193 nm, and a fluorine laser for emitting a fluorine laser beam having a wavelength of about 157 nm. After light emitted from the light source is transmitted to the photo mask 120, the intensity of the light may be selectively adjusted by the grating pattern and irradiated onto the photoresist film 104.

Figure 9:
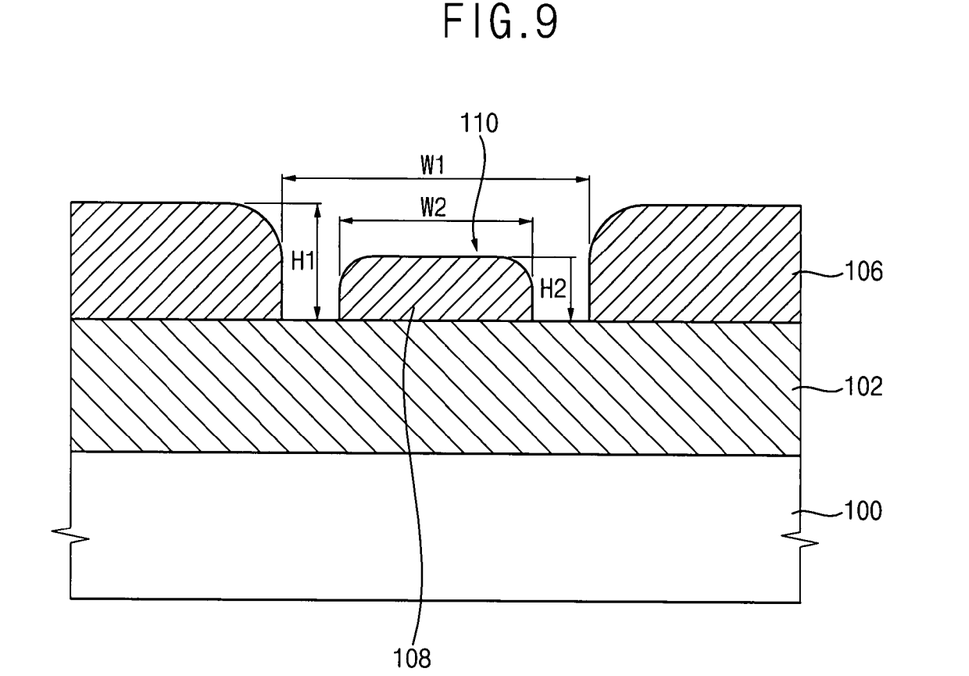

Referring to FIG. 9, the exposed photoresist film 104 may be developed to form the main photoresist pattern 106 and the auxiliary photoresist pattern 108. As mentioned above, the first region of the photoresist film 104 may be subjected to a first exposure energy, and the second region of the photoresist film 104 may be subjected to a second exposure energy, wherein the second exposure energy may be higher than the first exposure energy. The exposed photoresist film 104 may be developed to simultaneously form the main photoresist pattern 106 having a second opening 110, which may partially expose the layer 102, and the auxiliary photoresist pattern 108 in the second opening 110.

A thickness ratio and a width ratio of the main photoresist pattern 106 to the auxiliary photoresist pattern 108 may be adjusted to reduce the size of the auxiliary overlay pattern 114 of the overlay mark 116 (FIG. 4). The thickness ratio of the main photoresist pattern 106 to the auxiliary photoresist pattern 108 may be about 1:0.5 to about 1:0.7. The width ratio of the second opening 110 of the main photoresist pattern 106 to the auxiliary photoresist pattern 108 may be about 1:0.5 to about 1:0.8. For example, the main photoresist pattern 106 may have a thickness H1 of about 0.3 μm to about 0.4 μm. The auxiliary photoresist pattern 108 may have a thickness H2 of about 0.2 μm to about 0.3 μm. The second opening 110 may have a width W1 of about 2.5 μm to about 3.5 μm. The auxiliary photoresist pattern 108 may have a width W2 of about 2.0 μm to about 3.0 μm.

As mentioned above, the light transmitted through the grating pattern may be diffracted. Consequently, the diffracted light may have a lower exposure energy. Thus, a region of the photoresist film 104 subjected to the light having the lower exposure energy may not be completely removed. In contrast, the light, which is not transmitted through the grating pattern, may not be diffracted. Consequently, the non-diffracted light may have a higher exposure energy. Thus, a region of the photoresist film 104 subjected to the light having the higher exposure energy may be completely removed. As a result, the thickness of the resulting auxiliary photoresist pattern 108 may be less than the thickness of the resulting main photoresist pattern 106.

The layer 102 may be etched using the main photoresist pattern 106 and the auxiliary photoresist pattern 108 as an etching mask to thereby form the main overlay pattern 112 and the auxiliary overlay pattern 114 (FIG. 4). The etching process may include an anisotropic etching process (e.g., a reactive ion etching (RIE) process). In a RIE process, reaction gases (e.g., $C_xF_y$-based gas, including $C_2F_6$, $C_3F_8$, $C_4F_8$) may be ionized in a process chamber. The ionized gases may be electrically accelerated to etch the layer 102. In a dry etching process, plasma may be generated to activate the reaction gases. To generate plasma, a higher frequency electric field may be applied to the reaction gases.

Etching process conditions may be determined in accordance with the process for forming the circuit pattern. According to example embodiments, byproducts generated by the etching process may not affect the process for forming the circuit pattern. For example, the opening 118 of the overlay mark 116 may have a width greater than the size of the byproduct. Thus, byproducts may accumulate in the opening 118 during etching. The byproducts may also accumulate on the auxiliary photoresist pattern 108 during etching. Consequently, the byproducts and the auxiliary photoresist pattern 108 may be simultaneously removed by the etching process. As a result, etching failures may be reduced or prevented. The etching process using the main photoresist pattern 106 and the auxiliary photoresist pattern 108 as the etching mask may be performed until the auxiliary photoresist pattern 108 is completely consumed or removed.

The remaining main photoresist pattern 106 may removed by an ashing process and/or a stripping process to achieve the overlay mark 116 including the main overlay pattern 112 and the auxiliary overlay pattern 114. The main overlay pattern 112 may have an opening 118 for exposing the semiconductor substrate 100. The auxiliary overlay pattern 114 may be situated in the opening 118. The auxiliary overlay pattern 114 may be spaced apart from the side wall/face of the main overlay pattern 112 defining the opening 118. A ratio of the height h4 of the auxiliary overlay pattern 114 to the height h3 of the opening 118 may range from about 0.05:1 to about 0.30:1. A ratio of the width W3 of the opening 118 to the height h3 of the opening 118 may be about 1:0.5 to about 1:0.6. A ratio of the width W3 of the opening 118 to the width W4 of the auxiliary overlay pattern 114 may be about 1:0.05 to about 1:0.30. As shown in FIG. 3, the openings 118a-d with the respective auxiliary overlay patterns 114a-d therein may extend along the surface of the semiconductor substrate 100.

The overlay mark 116 may linearly extend along the surface of the semiconductor substrate 100 so as to have a box shape. The auxiliary overlay pattern 114 in the opening 118 may extend therein in the elongated direction of the opening 118. The openings 118 may form a rectangular, annular shape. Consequently, the auxiliary overlay patterns 114 may also form a rectangular, annular shape. The shapes of the openings 118 and the auxiliary overlay patterns 114 may be illustrated in FIG. 3 but are not limited thereto.

The opening 118 may be larger than the lower recognition limit of an overlay measurement apparatus. In contrast, the auxiliary overlay pattern 114 may be smaller than the lower recognition limit of the overlay measurement apparatus. Thus, while the overlay mark 116 may be sufficiently large to enable more accurate overlay measurements, the auxiliary overlay pattern 114 may not affect the overlay measurement because of its smaller size. As a result, the overlay mark 116 may be formed more clearly so as to enable more accurate overlay measurements.

The method of forming an overlay mark according to example embodiments may also be employed in processes for forming an alignment mark on a semiconductor substrate. The alignment mark may be used to align the semiconductor substrate during an exposure process. According to example embodiments, the main photoresist pattern and the auxiliary photoresist pattern may be used as an etching mask to form the overlay mark. Consequently, byproducts, which may be generated by the etching process, together with the auxiliary photoresist pattern may be simultaneously removed so as to reduce or prevent etching failures. As a result, the overlay mark may have a clearer shape and a more desired width. Accordingly, overlay accuracy measurements may be improved using the overlay mark according to example embodiments.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:

1. An overlay mark comprising:
    a main overlay pattern having an opening exposing a substrate; and
    an auxiliary overlay pattern in the opening and spaced apart from a side wall of the main overlay pattern, wherein a ratio of auxiliary overlay pattern thickness to main overlay pattern thickness is about 0.05:1 to about 0.30:1.

2. The overlay mark of claim 1, wherein a ratio of opening width to opening height is about 1:0.5 to about 1:0.6.

3. The overlay mark of claim 1, wherein a ratio of opening width to auxiliary overlay pattern width is about 1:0.05 to about 1:0.30.

4. The overlay mark of claim 1, wherein the main overlay pattern includes substantially the same material as the auxiliary overlay pattern.

5. The overlay mark of claim 1, wherein the opening and the auxiliary overlay pattern extend along a surface of the substrate.

6. The overlay mark of claim 1, wherein the opening and the auxiliary overlay pattern have a rectangular, annular shape.

7. A method of forming an overlay mark, comprising:
    forming a layer on a substrate; and
    patterning the layer to form a main overlay pattern and an auxiliary overlay pattern,
    wherein the main overlay pattern has an opening exposing a substrate, the auxiliary overlay pattern is in the opening and spaced apart from a side wall of the main overlay pattern, and a ratio of auxiliary overlay pattern thickness to main overlay pattern thickness is about 0.05:1 to about 0.30:1.

8. The method of claim 7, wherein a ratio of opening width to opening height is about 1:0.5 to about 1:0.6.

9. The method of claim 7, wherein a ratio of opening width to auxiliary overlay pattern width is about 1:0.05 to about 1:0.30.

10. The method of claim 7, wherein forming the main overlay pattern and the auxiliary overlay pattern includes:
    forming a main photoresist pattern and an auxiliary photoresist pattern on the layer, the main photoresist pattern having a second opening exposing the layer, and the auxiliary photoresist pattern in the second opening; and
    etching the layer using the main photoresist pattern and the auxiliary photoresist pattern as an etching mask to form the main overlay pattern and the auxiliary overlay pattern.

11. The method of claim 10, wherein forming the main photoresist pattern and the auxiliary photoresist pattern includes:
    forming a photoresist film on the layer;
    providing a photo mask having a first light transmission portion and a second light transmission portion over the photoresist film;
    irradiating a first light having a first light intensity through the first light transmission portion of the photo mask onto a first region of the photoresist film;

irradiating a second light having a second light intensity through the second light transmission portion of the photo mask onto a second region of the photoresist film, the second light intensity being higher than the first light intensity; and developing the irradiated regions of the photoresist film to form the main photoresist pattern and the auxiliary photoresist pattern.

12. The method of claim 11, further comprising:

providing a grating pattern in the first light transmission portion of the photo mask to control the first light intensity.

13. The method of claim 12, wherein the grating pattern includes line-and-space patterns extending in substantially the same direction.

14. The method of claim 13, wherein a ratio of critical line width to critical space width in the line-and-space patterns is about 1:1.

15. The method of claim 13, wherein the critical line and space width in the line-and-space patterns is about 25 nm to about 50 nm.

16. The method of claim 10, wherein a ratio of main photoresist pattern thickness to auxiliary photoresist pattern thickness is about 1:0.5 to about 1:0.7.

17. The method of claim 10, wherein a ratio of second opening width to auxiliary photoresist pattern width is about 1:0.5 to about 1:0.8.

18. The method of claim 11, wherein the first light intensity is about 30% to about 50% of the second light intensity.

19. The method of claim 10, wherein the layer is etched until the auxiliary photoresist pattern is removed.

20. The method of claim 7, wherein the opening and auxiliary overlay pattern extend along a surface of the substrate.

* * * * *